United States Patent

Sahm, III et al.

[15] 3,660,687

[45] May 2, 1972

[54] HYSTERESIS-FREE BIDIRECTIONAL THYRISTOR TRIGGER

[72] Inventors: William H. Sahm, III; Taras Shepelavy, both of Syracuse, N.Y.

[73] Assignee: General Electric Company

[22] Filed: Feb. 12, 1971

[21] Appl. No.: 114,934

[52] U.S. Cl. ............................307/252 B, 307/255, 307/287, 307/293, 307/303, 307/305, 307/313

[51] Int. Cl. ..................H03k 3/31, H03k 17/66, H03k 17/68

[58] Field of Search ..................307/246, 255, 252 B, 252 N, 307/252 Q, 252 T, 252 UA, 284, 287, 293, 288, 299, 302, 303, 305

[56] References Cited

UNITED STATES PATENTS

| | | | |
|---|---|---|---|
| 3,207,962 | 9/1965 | Slusher | 307/305 X |
| 3,302,128 | 1/1967 | Schoemehl et al. | 307/293 X |
| 3,334,244 | 8/1967 | Hanchett | 307/252 Q |
| 3,346,874 | 10/1967 | Howell | 307/252 B |
| 3,515,902 | 6/1970 | Howell | 307/252 B |
| 3,526,003 | 8/1970 | Granieri | 307/252 B |
| 3,553,495 | 1/1971 | Shaugnessy | 307/247 R X |

OTHER PUBLICATIONS

G.E. Electronic Innovations (Semiconductors Products Dept.), " Silicone Unilateral Switch (SUS)," D13D1 65.25, 2/1966; G.E. application note 90.16, 6/1964, page 3.

Electronic Design, 8/30/1966, " Thyristor Triggering is Sure-Fire," pp. 38–42.

*Primary Examiner*—John S. Heyman

*Assistant Examiner*—L. N. Anagnos

*Attorney*—Robert J. Mooney, Nathan J. Cornfeld, Frank L. Neuhauser, Oscar B. Waddell and Joseph B. Forman

[57] ABSTRACT

A semiconductor monolithic integrated trigger control circuit for low hysteresis firing of bidirectional thyristors is provided having a non-symmetrical voltage-current characteristic.

6 Claims, 10 Drawing Figures

INVENTORS:
WILLIAM H. SAHM III,
TARAS SHEPELAVY,
BY Robert J. Mooney
THEIR ATTORNEY.

INVENTORS:
WILLIAM H. SAHM III,
TARAS SHEPELAVY,
BY Robert J. Mooney
THEIR ATTORNEY.

INVENTORS:
WILLIAM H. SAHM III,
TARAS SHEPELAVY,
BY Robert J. Mooney
THEIR ATTORNEY.

HYSTERESIS-FREE BIDIRECTIONAL THYRISTOR TRIGGER

The present invention relates to semiconductor devices for controlling the triggering of bidirectional thyristors with minimal hysteresis, and more particularly to an improved monolithic integrated circuit form of such a device.

AC power controls employing load-current carrying bidirectional thyristors such as triacs, and wherein the turn-on or firing of the thyristor at a desired phase angle of the supply voltage wave is accomplished by a control voltage generated by a resistor-capacitor control circuit, are well known in the art. The thyristor firing control circuit includes a variable resistor and capacitor network, which performs the dual function of providing an adjustable time delay, or phase delay, for selected phase angle firing of the thyristor, as well as storage of thyristor triggering energy. The firing control circuit also includes a bilateral, threshold voltage responsive, trigger device or subcircuit which switches the energy stored in the capacitor as firing current to the gate of the thyristor when the capacitor is charged to a level such that the voltage across the trigger device exceeds its threshold voltage. Such thyristor control circuits are known to be subject to an undesirable hysteresis effect which causes the thyristor when turned on, to supply a higher level of power to the load than desired. One example of such a hysteresis effect may be found in conventional phase-controlled lamp dimmer circuits wherein the lamp cannot be turned on at minimum brightness but initially turns on at a brightness level higher than desired and the control must be readjusted after turn-on in order to obtain desired minimum brightness.

Various trigger control circuits specially designed for minimizing this hysteresis effect are known. However, all of such trigger circuits heretofore available have had one or more important disadvantages such as requiring additional circuit components which significantly increase the cost of the resulting control, or undesirably limiting the range of phase angles over which the thyristor can be fired, or adding excessively to processing costs or assembly costs, or being too bulky.

Accordingly, one object of the present invention is to provide an improved trigger control circuit for minimal hysteresis phase control firing of bidirectional thyristors, and which has a minimal component count, provides thyristor phase control firing through essentially the entire 180° phase angle range, and is particularly suitable for very low cost manufacture and packaging with very small physical size.

Another object is to provide thyristor trigger control means of the foregoing character which is of semiconductor monolithic integrated form, and which is particularly suitable for low cost manufacturing by conventional transistor processing requiring only two impurity diffusion steps, which does not need isolation diffusion or other special intercomponent isolation, and which includes special low cost features for preventing parasitic transistor action by minority carrier injection.

Another object is to provide trigger control means of the foregoing character which enables thyristor phase control firing with less than 3 percent hysteresis observed.

These and other objects of the present invention will be more fully apparent from a consideration of the following description and the accompanying drawings wherein.

Figure 1:
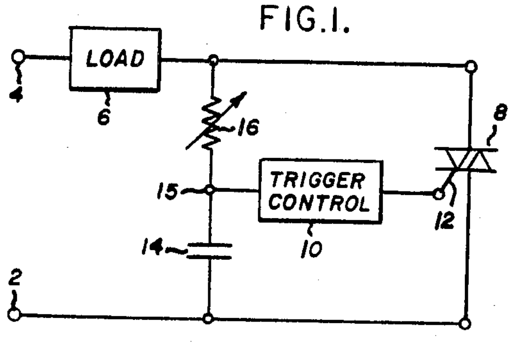
FIG. 1 is a semi-schematic and block diagram of an exemplary AC power control including a bidirectional thyristor, and to which the trigger control circuit of the present invention is particularly applicable.

Turning to FIG. 1 of the drawing, there is shown an exemplary well known form of circuit for bidirectional thyristor control of power from an AC supply voltage to a resistive load. The circuit shown in FIG. 1, includes terminals 2, 4 adapted to be connected to an AC supply voltage source (not shown), current from which is allowed to flow through the load 6 under the control of a main load current carrying thyristor 8 in series with load 6. The thyristor 8 is "bidirectional" in the sense that it is capable, responsive to firing control current applied through trigger control 10 to its gate terminal 12, of turning on and conducting load current during any desired portion of each successive half-cycle of the AC supply voltage. The time or phase angle of turn-on of thyristor 12 depends on when the voltage across capacitor 14 charging through variable resistor 16 reaches a level at terminal 15 sufficient to exceed the voltage breakover threshold of trigger control 10 and pass firing current to gate 12 of thyristor 8. When the thyristor conducts for only a few phase angle degrees of the 180° of each supply voltage half-cycle, very little power is conveyed to the load. But as the duration of thyristor conduction is lengthened by turning the thyristor on earlier in each supply voltage half-cycle, the duration of current flow, and resulting power to the load, correspondingly increases.

Figure 2:
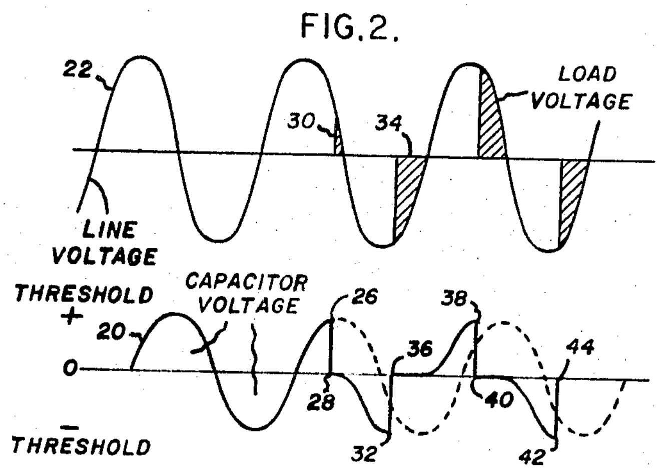
FIG. 2 is a graph of voltage wave forms illustrating the operation of the circuit of FIG. 1.
Figure 3:
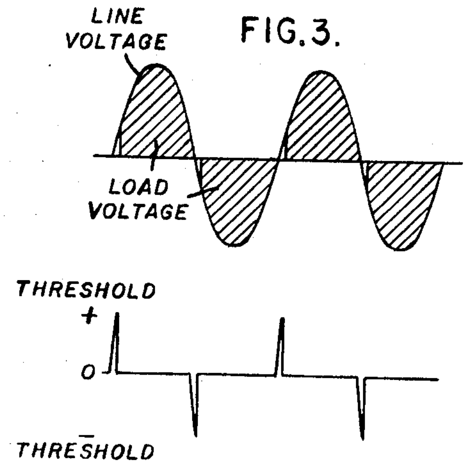
FIG. 3 is similar to FIG. 2 but illustrates the operation of the circuit of FIG. 1 at a different power control setting.
Figure 4:
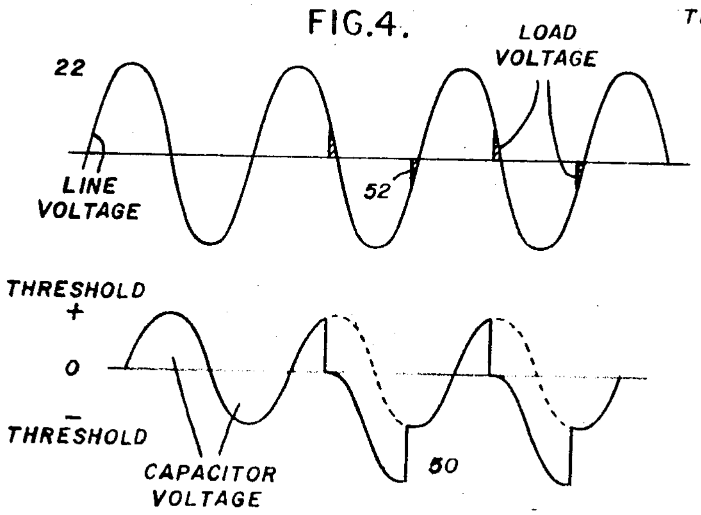
FIG. 4 is similar to FIG. 2 but illustrates the modified operation resulting from the present invention.

For ease of understanding in the circuit of FIG. 1 of the effect referred to herein as "hysteresis," the graphs of FIGS. 2, 3, and 4 are provided. As will be evident from the graph of FIG. 2, the voltage across the triggering-current storage capacitor 14, when the thyristor 8 is continuously off, varies sinusoidally as shown by curve 20 and lags the AC supply voltage, shown by curve 22, by a phase angle of 90°. During each half-cycle of the AC supply voltage when thyristor 8 is off, capacitor 14 first discharges its previous charge, and then charges toward maximum voltage of the same polarity as the supply voltage half-cycle. With resistor 16 set at a high enough value, capacitor 14 does not charge to a voltage at terminal 15 high enough to exceed the threshold voltage level, indicated at 24, required for current to flow through trigger control 10 to thyristor gate 12, so thyristor 8 does not turn on. However, as the resistance of resistor 16 is reduced capacitor 14 charges more quickly and toward a higher voltage, and at a point designated 26 in FIG. 2, the capacitor voltage reaches the necessary threshold value for current conduction through the trigger control 10 and thyristor 8 is turned on. When thyristor 8 turns on, capacitor 14 is abruptly discharged through the relatively low series resistance presented by the trigger control 10 and the thyristor gate-to-anode impedance, and the capacitor voltage thus falls abruptly to the value, near zero, depicted at point 28 in FIG. 2. The thyristor is thus turned on as shown at 30 for a tiny portion, i.e., a few phase angle degrees, of that particular half-cycle of the AC supply voltage, and the desired very small amount of power is conveyed to the load.

During the next half-cycle of the supply voltage, however, capacitor 14 starts charging not from its voltage maximum of the opposite polarity but from the essentially zero voltage at point 28. Thus capacitor 14 charges to the threshold voltage of trigger control 10 and produces thyristor turn-on, depicted at point 32, much earlier in the half-cycle of AC supply voltage than desired. And the thyristor, instead of being turned on for only a few degrees of phase angle, is turned on for a much larger portion of the supply voltage half-cycle, as shown at 34 in the graph. The successive capacitor discharges shown by lines 32 to 36, 38 to 40, and 42 to 44 during further successive half-cycles of the supply voltage ensure that the thyristor will continue to be turned on much earlier in each half-cycle of supply voltage than desired, and much more power will be delivered to the load than desired.

Thus with a bidirectional thyristor triggering circuit operating as shown in FIG. 2, turn-up of power to the load from zero causes an objectionable step increase, or snap action, to a power level much higher than desired. And in order to reduce the load power to the desired low level, a second adjustment of resistor 16 is necessary. This objectionable phenomenon, to which the term "hysteresis" is herein applied, does not occur during turn-down of power from full, 180° per half-cycle, conduction of the thyristor because, as shown in FIG. 3, under such conditions capacitor 14 is discharged early in each half-cycle of the supply voltage and never charges from a voltage other than essentially zero.

Figure 5:
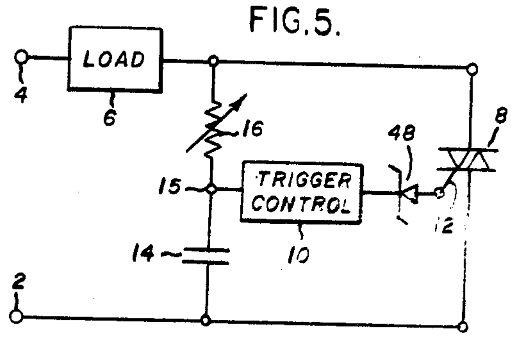
FIG. 5 is similar to FIG. 1 but shows an alternative prior art embodiment of AC power control.

Prior art solutions to this hysteresis problem have included the provision of a zener diode 48 in series between the trigger control 10 and thyristor gate 12 as shown in FIG. 5, and as described more fully, for example in U.S. patent application Ser. No. 724,748 filed Apr. 29, 1968 and assigned to the same assignee as the present invention. The zener diode is designed to have a zener voltage of approximately the voltage by which capacitor 14 discharges for thyristor turn-on, e.g., the voltage drop between point 26 and point 28 in FIG. 2. Presence of the zener diode requires the capacitor to charge to a high threshold voltage in one polarity, as shown by point 50 in FIG. 4, before thyristor firing. The higher threshold is the sum of the threshold voltage of trigger control 10 and zener diode 48. The result is that the voltage swing of capacitor 14, from one discharge point to the next, is the same in each polarity, and consequently as shown at 52 in FIG. 4 the load voltage does not jump up at thyristor turn-on to a higher value than desired.

Figure 6:
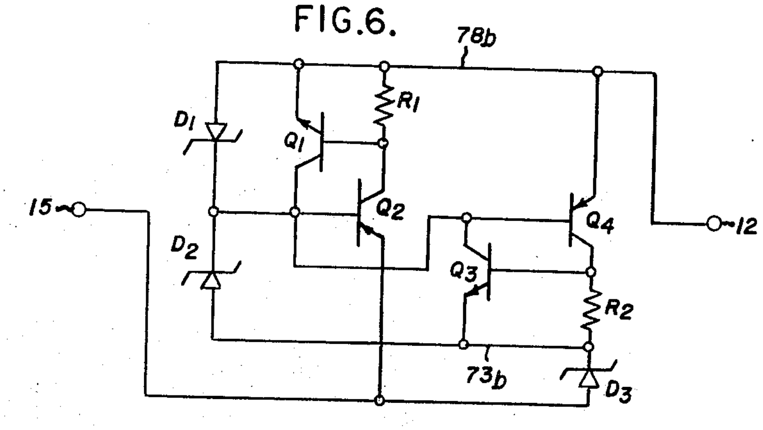
FIG. 6 is a schematic diagram of one embodiment of thyristor trigger control circuit constructed in accordance with the present invention.

FIG. 6 shows a schematic circuit diagram of one embodiment of the improved low hysteresis trigger control circuit of the present invention, which is particularly suited for connection between terminals such as 14 and 12 of FIG. 1. The circuit of FIG. 6 consists of two NPN-transistors Q1, Q3, two PNP-transistors Q2, Q4, two resistors R1, R2, which preferably each have a value of about 20,000 ohms, and three zener diodes, which preferably have zener voltages of about 8 volts, connected as shown and monolithically integrated as will be described in detail hereinafter.

In the operation of the circuit of FIG. 6, as the voltage at terminal 15, which is connected to the common point of resistor 16 and capacitor 14, becomes increasingly positive relative to terminal 12, the trigger control circuit is initially in a non-conducting state. That is, it presents a high impedance between terminal 15 and terminal 12 and prevents flow of triggering current to the gate of thyristor 8. When the voltage at terminal 15 increases to a level equal to the sum of the breakover voltage of diode D1 and the forward bias voltage of the base-emitter junction of transistor Q2, current begins to flow through these regions (i.e., from terminal 15 to terminal 12). The current flow from the emitter to the base of Q2 causes current flow from the emitter to the collector of Q2 by normal transistor action. The collector current of Q2 flows into R1 and the base of transistor Q1. The current flowing into the base of Q1 causes a current flow from the collector to the emitter of Q1 by normal transistor action. The collector current of Q1 is additional base current to Q2.

Figure 7:
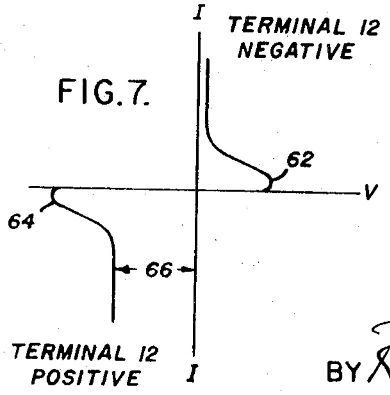
FIG. 7 is a graph of current and voltage wave forms illustrating one aspect of the operation of the circuit of FIG. 6.

At a current level determined by the gain of transistors Q1 and Q2 and the value of resistor R1, the combination of Q1 and Q2 becomes regenerative in the well known PNPN mode and goes into a high-conduction state presenting a low impedance path between the emitter of Q2, or terminal 15, and the emitter of Q1, or terminal 12. This enables discharge of capacitor 14 through the thus-formed low impedance path between terminal 15 and terminal 12 into the gate of thyristor 8 with resultant turn-on of the thyristor. The current voltage relationships of such turn-on action are shown graphically in FIG. 7, wherein the thyristor triggering current flowing from terminal 15 to terminal 12 is plotted as the ordinate and the voltage of terminal 15 relative to terminal 12 is plotted as the abscissa. As shown in FIG. 7 the voltage of terminal 15 relative to terminal 12 increases as capacitor 14 charges, until the threshold value of firing voltage is reached, as depicted at point 62 in FIG. 7 and equal to the breakover voltage of D1 plus forward bias voltage of the Q2 base-emitter junction, whereupon the regenerative action just described takes place and the impedance of the current flow path between terminals 15 and 12 regeneratively switches from a high value to a low value.

Operation of the circuit of FIG. 6 with the polarity reversed, namely with terminal 12 increasingly positive with respect to terminal 15, will now be described. When the capacitor begins to charge with terminal 15 negative and the bias voltage at terminal 12 reaches the threshold value of firing voltage equal to the sum of the breakover voltage of D2 plus D3 and the forward bias voltage of the base emitter junction of Q2, which total voltage is depicted at point 64 in FIG. 7, current flow begins through these regions from terminal 12 to terminal 15. The current flow from emitter to base of transistor Q4 causes current flow from emitter to collector of Q4 by normal transistor action. The collector current of Q4 flows into R2 and the base of Q3. That portion of the current flowing into the base of Q3 causes a current flow from the collector to the emitter of Q3 by normal transistor action. The collector current of Q3 is additional base-emitter current to Q4. At a current level determined by the gain of transistors Q3 and Q4 and the value of resistor R2, the combination of Q3 and Q4 becomes regenerative in the well known PNPN mode and this portion of the device goes into a high conduction state providing a lowered impedance path for current flow from terminal 12 to terminal 15. In this case, however, capacitor 14 does not discharge to a voltage lower than the breakover voltage of D3, as shown at 66 in FIG. 7.

Figure 8:
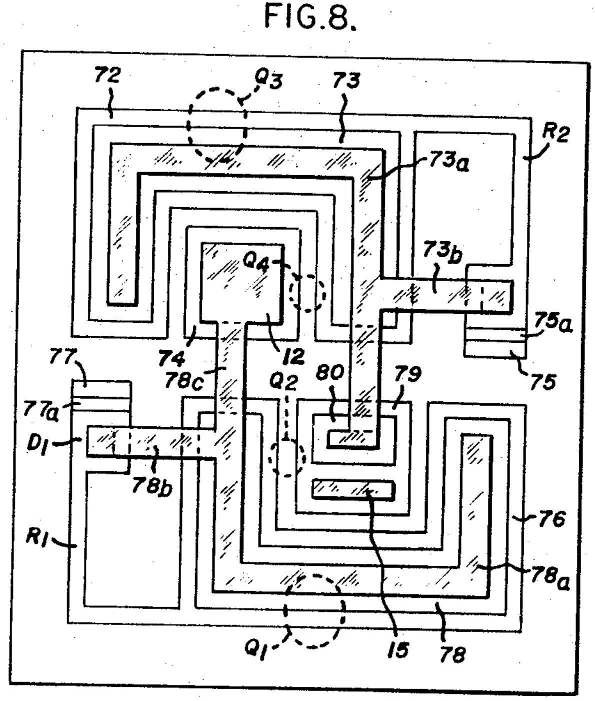
FIG. 8 is a plan view of a semiconductor monolithic integrated embodiment of the circuit of FIG. 6 according to the present invention.

FIG. 8 shows a plan view of a wafer or pellet-like semiconductor body consisting a monolithically integrated embodiment of the circuit of FIG. 6. For maximum economy of manufacture, the structure of FIG. 8 is made, according to the invention, without isolation diffusion between transistors. Also, using conventional photolithographic, insulatively masked and passivated, impurity diffusion PN-junction formation techniques, only two diffusion steps are involved in the processing, again to minimize cost. Although it will be appreciated that within the contemplation of the present invention all polarities or conductivity types may be reversed from those explicitly identified in the following description, in the exemplary embodiment shown in FIG. 8 the parent substrate semiconductor material 71 is of N-type conductivity.

Substrate 71 serves as the collector of transistors Q1 and Q3, which are vertical NPN's, and as the base of transistors Q2 and Q4, which are lateral PNP's. Region 72 is formed by the first, or P-type, diffusion. It serves as the base of Q3 and as the collector of Q4. An extended portion of region 72 also forms resistor R2 and the anode of diode D2. Region 73 is formed by the second, or N-type, diffusion. It serves as the emitter of Q3. Contact metallization 73*a* for the emitter of Q3 extends at 73*b* to the extremity of R2 remote from the base of Q3. Region 74 is formed by the P-type diffusion. It serves as the emitter of lateral transistor Q4. A contact metal layer on the surface of region 74 provides terminal 12. Region 75 is formed by the N-type diffusion. It slightly overlaps region 72 as shown at 75*a* and serves as the cathode of D2. Region 76 is formed by the P-type diffusion. It serves as the base of vertical transistor Q1, the collector of lateral transistor Q2, and has an extended portion forming resistor R1 and the anode of D1. Region 77 is formed by the N-type diffusion. It slightly overlaps region 76 as shown at 77*a* and serves as the cathode of D1. Region 78 is formed by the N-type diffusion. It serves as the emitter of Q1. Contact metallization 78*a* for the emitter of Q1 extends at 78*b* to the extremity of R1 remote from the base of Q1, and extends at 78*c* to terminal 12. Region 79 is formed by the P-type diffusion. It serves as the emitter of lateral transistor Q2 and the anode of D3. Contact metallization on the surface of region 79 constitutes terminal 15. Region 80 is formed by the N-type diffusion. It serves as the cathode of D3.

A particularly advantageous feature of the circuit shown in FIGS. 6 and 8 is that its manufacture requires only two impurity diffusion steps for minimum cost processing, and no diffusion isolation or other special interelement isolation. Moreover the placement and connection of diode D3 with its cathode directly connected to R2 and its anode directly connected to the emitter of Q2, as shown, prevents parasitic transistor or PNPN action between the N-type cathode of D3, P-type anode of D3, N-type substrate 71, and P-type emitter of Q2.

Figure 9:
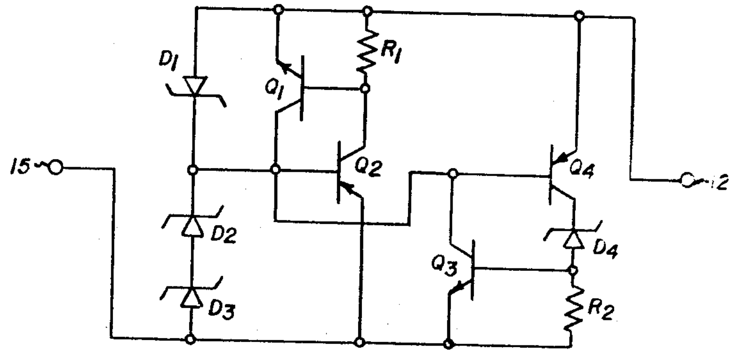
FIG. 9 is a schematic diagram of another embodiment of thyristor trigger control circuit constructed according to the present invention.

FIG. 9 shows a schematic circuit diagram of another embodiment of the present invention, arranged to be connected between terminals such as 15 and 12 of FIG. 1. The circuit of FIG. 9 consists of two NPN-transistors Q1, Q3, two PNP-transistors Q2, Q4, two resistors R1, R2 each of about 20,000 ohms magnitude, and four zener diodes D1, D2, D3, D4 having zener voltages of about 8 volts, connected as shown and monolithically integrated as will be described in detail hereinafter. In the operation of the circuit of FIG. 9 for the case when terminal 15 is increasingly positive relative to terminal 12, the trigger control circuit is initially non-conducting but becomes conducting when the voltage at terminal 15 equals the sum of the breakover voltage of diode D1 and the forward bias voltage of the base emitter junction of transistor Q2. When this happens the combination of Q1 and Q2 becomes regenerative in the well-known PNPN mode as described with respect to the circuit of FIG. 6 and presents a low impedance path between the emitter of Q2, or terminal 15, and the emitter of Q1, or terminal 12. Capacitor 14 then discharges through this low impedance path into the gate of thyristor 8 and the thyristor turns on as shown at point 62 in FIG. 7.

In the operation of the circuit of FIG. 9 with the polarity reversed, namely, with terminal 12 increasingly positive with respect to terminal 15, conduction is initiated through the base-emitter junction of Q4 and the breakdown of diodes D2 and D3. However, regenerative PNPN action does not occur unless the voltage at terminal 12 exceeds that at terminal 15 by an amount equal to the sum of the collector-emitter saturation voltage of Q4 plus the breakdown voltage of D4 plus the forward bias voltage of the base-emitter junction of Q3. When this condition is satisfied regenerative PNPN action involving Q3 and Q4 does occur and voltage between terminals 12 and 15 falls to a level not lower than the zener voltage of diode D4, which, as shown at 66 in FIG. 7, maintains the unsymmetrical voltage-current characteristic of the trigger control switching action desired to minimize hysteresis.

Figure 10:
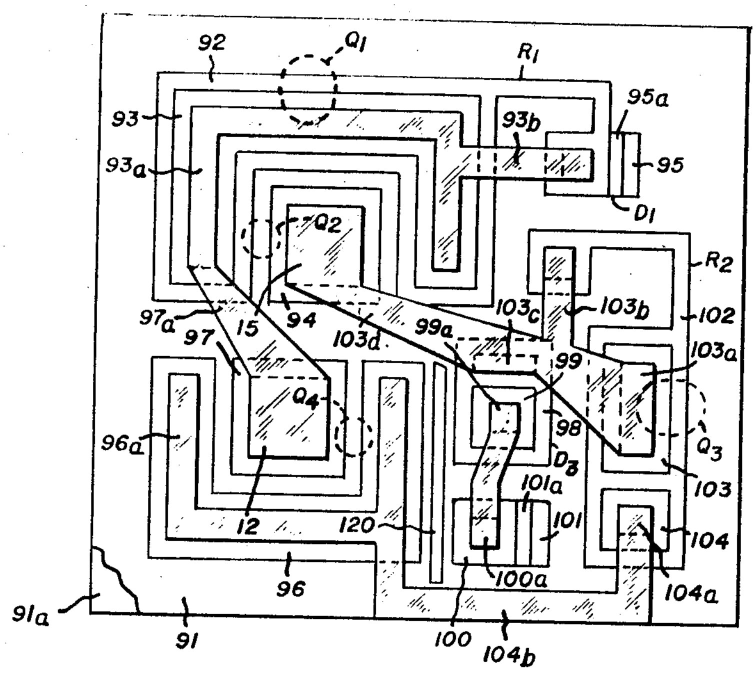
FIG. 10 is a plan view of a semiconductor monolithic integrated embodiment of the circuit of FIG. 9 according to the present invention.

FIG. 10 shows a plan view of a wafer or pellet-like semiconductor body constituting a monolithically integrated embodiment of the circuit of FIG. 9. Like the structure of FIG. 8, the structure of FIG. 10 is made, according to the invention, without any isolation diffusion and using only two impurity diffusion steps in the processing. Again like FIG. 8, it will be appreciated that the structure of FIG. 10 may have all polarities or conductivity types reversed from those specifically identified in the following description. In the structure of FIG. 10, region 91 is an epitaxial layer of N-type conductivity provided on an underlying N-type substrate **91*a*. The substrate 91*a* has a relatively high impurity concentration of, for example, about $8 \times 10^{18}$ impurity atoms per cubic centimeter and providing a resistivity of about 0.01 ohm-centimeters. The substrate 91*a* may have a thickness of, for example, 5 mils. The epitaxial layer 91 is preferably about 20 microns thick and may have a resistivity of, for example, about 2.4 ohm-centimeters with an impurity concentration of about $10^{20}$ impurity atoms per cubic centimeter. The epitaxial layer 91 serves as the collector of vertical transistors Q1 and Q3, and as the base of lateral transistors Q2 and Q4. Region 92 is formed by the first, or P-type, diffusion. It serves as the base of Q1, as the collector of Q2, and an extended portion of region 92 forms resistor R1 and the anode of D1. Region 93 is formed by the second, or N-type, diffusion. It serves as the emitter of Q1. Contact metallization 93*a* for the emitter of Q1 extends at 93*b* to the extremity of R1 remote from the base of Z1. Region 94 is formed by the P-type diffusion. It serves as the emitter of Q2. A contact metal layer on the surface of region 94 provides terminal 15. Region 95 is formed by the N-type diffusion. It slightly overlaps region 92 as shown at 95*a* and serves as the cathode of D1. Region 96 is formed by the P-type diffusion and serves as the collector of Q4. Region 97 is formed by the P-type diffusion and serves as the emitter of Q4. A contact metallization on the surface of region 97 provides terminal 12 and extends at 97*a* to metallization 93*a*. Region 98 is formed by the P-type diffusion. It serves as the anode of D3. Region 99 is formed by the N-type diffusion and serves as the cathode of D3. Region 100 is formed by the P-type diffusion and serves as the anode of D2. Region 101 is formed by the N-type diffusion. It slightly overlaps region 100 as shown at 100*a* and serves as the cathode of D2. Region 102 is formed by the P-type diffusion. It serves as the base of Q3. An extended portion of region 102 also forms resistor R2 and the anode of diode D4. Region 103 is formed by the N-type diffusion and serves as the emitter of Q3. Contact metallization 103*a* for the emitter of Q3 extends at 103*b* to the extremity of R2 remote from the base of Q3 and also extends at 103*c* to the anode of D3 and at 103*d* to terminal 15. Region 104 is formed by the N-type diffusion and serves as the cathode of D4. Contact metallization 104*a* on the surface of region 104 extends at 104*b* to a contact 96*a* on the surface of region 96. Contact metallization 99*a* on the surface of region 99 extends at 100*a* to the surface of region 100**.

The circuit shown in FIGS. 9 and 10 has the advantage, relative to that of FIGS. 6 and 8, that none of the zener diodes need carry all of the discharge current of capacitor 14, but rather this capacitor discharge current flows either through the regenerative PNPN structure formed by Q1 and Q2 or, during regenerative PNPN action in the structure formed by Q3 and Q4, the capacitor discharge current is shared by D4 and the collector current of Q3, with the latter having the largest share because the beta of the vertical transistor Q3 is much higher than the beta of the lateral transistor Q4. Thus the zener diodes of FIGS. 9 and 10 can be of smaller area, less costly, easier to manufacture with high yields, and by consuming less internal power such smaller zener diodes ensure transmission of more of the capacitor discharge energy to the thyristor gate.

Another advantage of the circuit of FIGS. 9 and 10 is that undesired parasitic PNPN regenerative action is effectively suppressed, without isolation diffusion or other special interelement isolation, because of the gettering or recombination effect caused by the relatively low resistivity substrate on minority carriers in the very thin epitaxial layer. This effectively minimizes the diffusion length for minority carriers parasitically injected, without appreciably affecting minority carrier flow in the transistors themselves, particularly lateral transistors Q2 and Q4. This prevents, for example, parasitic transistor or PNPN action between the P-type emitter of Q4 and P-type base of Q3 through the N-type epitaxial layer 91, the undesirable result of which would effectively bypass D4 and destroy the asymmetrical voltage-current conduction characteristics shown in FIG. 7. Further suppression of parasitic effects can, if desired, be obtained by introduction in the structure of FIG. 10, during the N diffusion step, of a barrier N region, as shown at 120 in FIG. 10, between Q3 and Q4.

Thus there has been shown and described an improved low cost trigger control circuit for turning on bidirectional gated thyristors with minimal hysteresis, which is particularly suited for low cost manufacture in semiconductor monolithic integrated form with only two impurity diffusion steps, and which self-suppresses parasitics without requiring diffusion isolation or other special interelement isolation.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. A turn-on control circuit for a gated bidirectional thyristor comprising a first terminal adapted to be connected to the thyristor gate and a second terminal adapted to be connected to a source of turn-on triggering voltage, a first pair of first and second transistors having their respective emitters connected to said respective terminals and each having its base connected to the collector of the other for regenerative PNPN switching from a relatively high impedance state between said emitters to a relatively low impedance state between said emitters, a second pair of third and fourth transistors, said fourth transistor having its emitter connected to said first terminal and having its base connected to the collector of the third transistor for regenerative PNPN switching from a relatively high impedance to a relatively low impedance between the emitters of said second pair of transistors, a first resistor connected between the emitter and base of the first transistor, a second resistor connected between the emitter and base of the third transistor, at least one zener diode connected between the emitter and collector of the first transistor and poled to oppose PNPN switching of said first pair of transistors to said low impedance state, at lease one zener diode connected between the emitter and collector of the third transistor and poled to oppose PNPN switching of said second pair of transistors to said low impedance state, the collector of said first transistor being connected to the collector of said third transistor and the base of said fourth transistor, and an additional zener diode being serially connected with said second resistor between the collector of said fourth transistor and the emitter of said second transistor, whereby the voltage between said terminals after switching of said second pair of transistors said low impedance state cannot fall below the breakover voltage of said additional zener diode.

2. A thyristor turn-on control circuit as defined in claim 1 wherein said additional zener diode is connected between said second resistor and the emitter of said second transistor.

3. A thyristor turn-on control circuit as defined in claim 1 wherein said additional zener diode is connected between said second resistor and the collector of said fourth transistor.

4. A thyristor turn-on control circuit as defined in claim 1 wherein all of said transistors, resistors, and zeners are disposed in a single monolithic body of semiconductor material, said monolithic body consisting of a substrate portion of one conductivity type and a set of inset first regions of opposite conductivity type, some of said first regions having inset second regions of said one conductivity type.

5. The circuit of claim 1 wherein the zener voltage of said additional zener diode approximate the voltage drop between the said terminals when said first pair of transistors regeneratively switches to said low impedance state.

6. The circuit of claim 3 wherein said substrate comprises a relatively thin epitaxial layer of relatively high resistivity on a relatively thin underlayer of relatively low resistivity providing recombination centers for parasitic minority carriers injected into said substrate.

* * * * *